(12) United States Patent
Sharma et al.

(10) Patent No.: US 6,566,761 B1
(45) Date of Patent: May 20, 2003

(54) ELECTRONIC DEVICE PACKAGE WITH HIGH SPEED SIGNAL INTERCONNECT BETWEEN DIE PAD AND EXTERNAL SUBSTRATE PAD

(75) Inventors: Laxminarayan Sharma, San Diego, CA (US); Siamak Fazelpour, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 10/138,662

(22) Filed: May 3, 2002

(51) Int. Cl.[7] .......................... H01L 29/40; H01L 23/52
(52) U.S. Cl. .................. 257/778; 257/691; 257/693; 257/698
(58) Field of Search ................. 257/774, 778, 257/678, 698, 691, 693, 786, 781, 784

(56) References Cited

U.S. PATENT DOCUMENTS

| | | | | |
|---|---|---|---|---|
| 5,424,573 A | * | 6/1995 | Kato et al. ................. 257/431 |
| 5,532,906 A | * | 7/1996 | Hanari et al. ................ 361/749 |
| 5,708,567 A | * | 1/1998 | Shim et al. ................. 361/723 |
| 5,861,664 A | * | 1/1999 | Inoue ......................... 257/697 |
| 6,075,710 A | * | 6/2000 | Lau ............................ 361/760 |
| 6,272,020 B1 | * | 8/2001 | Tosaki et al. ............... 361/763 |
| 2002/0180027 A1 | * | 12/2002 | Yamaguchi et al. ........ 257/700 |

* cited by examiner

Primary Examiner—Jasmine J B Clark
(74) Attorney, Agent, or Firm—Gray Cary Ware & Freidenrich; Terrance A. Meador (57) ABSTRACT

An electronic device package includes a modified ball grid array ("BGA") interconnect substrate upon which a flip-chip device is mounted. The flip-chip device includes one or more high speed input/output solder bumps corresponding to input/output signals having data rates of up to 40 Gbps. A high speed solder bump is directly connected to an interconnect via formed within the BGA substrate, and the via is directly connected to a respective BGA solder ball positioned at an interior point of the BGA solder ball matrix. The BGA substrate is void of BGA solder balls between the designated high speed BGA solder ball and at least one edge of the substrate, thus providing a clear path to the designated high speed BGA solder ball for a high speed conductive trace formed on a printed circuit board.

21 Claims, 4 Drawing Sheets

FIG. 7

ELECTRONIC DEVICE PACKAGE WITH HIGH SPEED SIGNAL INTERCONNECT BETWEEN DIE PAD AND EXTERNAL SUBSTRATE PAD

FIELD OF THE INVENTION

The present invention relates generally to electronic device packaging. More particularly, the present invention relates to ball grid array interconnect design.

BACKGROUND OF THE INVENTION

Electronic chips are often mounted in ball grid array ("BGA") packages that can be easily attached to a printed circuit board ("PCB") or an electronic component. A typical BGA package includes an electronic chip that is physically and electronically connected to a BGA substrate, which includes an interconnect arrangement that provides conductive paths between points on its chip-mounting surface and corresponding solder balls located on its board-mounting surface. BGA packages are often utilized for high speed electronic devices, e.g., circuits that handle input and/or output signals having data rates of up to 40 Gbps.

In high speed BGA applications, the high speed signals are routed to the perimeter of the BGA ball matrix to provide easy access to the high speed signals (from the perspective of the PCB designer). In this regard, lateral conductive traces must be formed on the BGA substrate to carry the high speed signals from the electronic chip to the perimeter of the BGA substrate; the lateral traces are necessary because the electronic chip is smaller than the BGA substrate. The transition from the lateral trace to the BGA via results in impedance mismatching, high insertion loss, and high reflection loss. In addition, the propagation of high speed signals on the lateral traces can lead to cross talk to adjacent signals and interconnect planes.

BRIEF SUMMARY OF THE INVENTION

An electronic device packaging technique according to the present invention improves the integrity of high speed signals carried by a BGA substrate. A BGA package configured in accordance with the present invention need not employ high speed lateral conductive traces from the electronic device to the perimeter of the BGA solder bump matrix. As a result, the signal paths for critical high speed input/output signals exhibit better impedance matching and lower insertion and reflection losses.

The above and other aspects of the present invention may be carried out in one form by an interconnect substrate for an electronic device. The interconnect substrate includes a device-mounting surface configured to receive an electronic device, a high speed input/output signal contact pad on the device-mounting surface, a component-mounting surface opposite the device-mounting surface, a number of peripheral conductive attachment elements on the component-mounting surface, a number of interior conductive attachment elements bordered by the peripheral conductive attachment elements, and an interconnect via having a first end directly connected to the high speed input/output signal contact pad and having a second end directly connected to one of the interior conductive attachment elements.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The particular implementations shown and described herein are illustrative of the invention and its best mode and are not intended to otherwise limit the scope of the invention in any way. Indeed, for the sake of brevity, conventional techniques related to electronic device manufacturing, high speed signal transmission, flip-chip design, solder bump composition, deposition, and reflow, and other aspects of the interconnect structures may not be described in detail herein.

Figure 1:
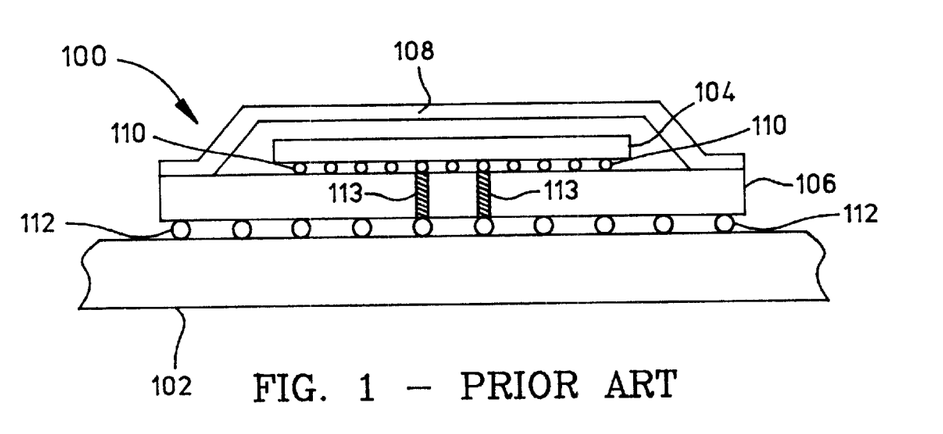
FIG. 1 is a schematic side view of a ball grid array package for an electronic device.

FIG. 1 is a schematic side view of a prior art ball grid array ("BGA") package 100 mounted to a printed circuit board ("PCB") 102. BGA package 100 generally includes an electronic device 104 coupled to a BGA substrate 106. In most practical applications, BGA package 100 also includes a lid 108 that protects electronic device 104. In FIG. 1, electronic device 104 is a flip-chip device having a plurality of solder bumps 110 formed on the mounting surface of electronic device 104. Solder bumps 110 correspond to connection points (e.g., input nodes, output nodes, power supply nodes, clock signal nodes, ground nodes, and the like) of the circuit or circuits of electronic device 104. Solder bumps 110 form electronic connections with corresponding conductive pads formed on the device-mounting surface of BGA substrate 106. In FIG. 1, the upper surface of BGA substrate 106 corresponds to its device-mounting surface.

BGA substrate 106 includes an interconnect arrangement (not completely shown) that connects solder bumps 110 to corresponding BGA solder balls 112 formed on the mounting surface of BGA substrate 106. In turn, BGA solder balls 112 are utilized to form electronic connections with corresponding conductive pads or traces formed on the upper surface of PCB 102. The interconnect arrangement typically includes vertical interconnect vias formed within BGA substrate 106 and lateral conductive traces formed on the upper and/or lower surfaces of BGA substrate 106. FIG. 1 depicts two interconnect vias 113 in dashed lines because they would otherwise be hidden from view. The lateral conductive traces facilitate horizontal signal propagation from solder bumps 110 (or solder balls 112) to other locations on BGA substrate 106.

The pitch between the flip-chip solder bumps 110, the size of the solder bumps 110, the composition of the solder bumps 110, and other physical and electrical characteristics of flip-chip devices may be dictated by industry standards, specifications, and recommendations. Likewise, the pitch between the BGA solder balls 112, the size of the solder balls 112, the composition of the solder balls 112, and other physical and electrical characteristics of BGA substrates may also be dictated by industry standards, specifications, and recommendations. For example, the JEDEC Solid State Technology Association publishes a number of standards that relate to flip-chip devices and BGA packages.

Figure 2:
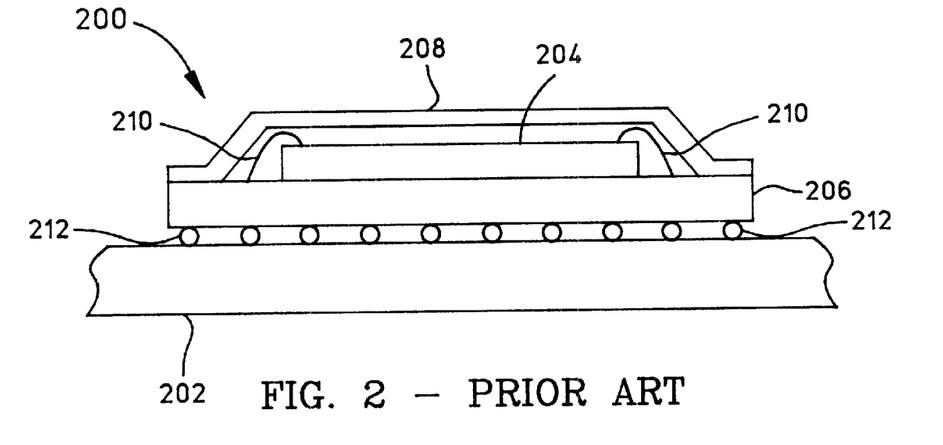
FIG. 2 is schematic side view of an alternate ball grid array package for an electronic device.

FIG. 2 is a schematic side view of another prior art BGA package 200 mounted to a PCB 202. BGA package 200 generally includes an electronic device 204 coupled to a BGA substrate 206. In most practical applications, BGA package 200 also includes a lid 208 that protects electronic device 204. In FIG. 2, electronic device 204 is a surface mount device having a number of exposed contact pads (not shown) formed on the upper surface of electronic device 204. These contact pads correspond to connection points (e.g., input nodes, output nodes, power supply nodes, clock signal nodes, ground nodes, and the like) of the circuit or circuits of electronic device 204. BGA package 200 utilizes wire bonds, ribbons, or other conductive elements 210 to establish electronic connections between the electronic device contact pads and corresponding conductive pads formed on the device-mounting surface of BGA substrate 206.

BGA substrate 206 includes an interconnect arrangement (not shown) that connects the conductive pads on the upper surface of BGA substrate 206 to corresponding BGA solder balls 212 formed on the mounting surface of BGA substrate 206. In turn, BGA solder balls 212 are utilized to form electronic connections with corresponding conductive pads or traces formed on the upper surface of PCB 202. The interconnect arrangement typically includes vertical interconnect vias formed within BGA substrate 206 and lateral conductive traces formed on the upper and/or lower surfaces of BGA substrate 206. The lateral conductive traces facilitate horizontal signal propagation from the upper contact pads (or solder balls 212) to other locations on BGA substrate 206.

Figure 3:
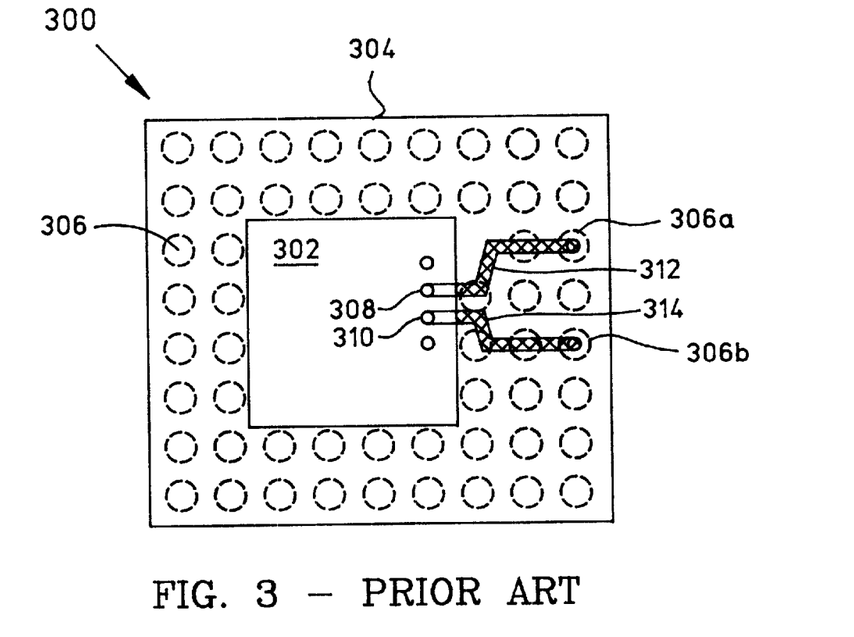
FIG. 3 is a top view of a prior art ball grid array package for an electronic device.

BGA packages, e.g., BGA packages 100/200 and other prior art electronic packages, are commonly used in high speed data communication applications that handle input/output data rates of up to 40 Gbps. Traditionally, high speed signals are routed to the outer perimeter of the BGA solder ball matrix to provide easy access to such signals on the PCB or motherboard. Due to the relatively small size of the electronic device, the high speed signals are routed to the outside of the BGA substrate using lateral traces. FIG. 3 is a top view of a prior art BGA package 300 that illustrates this feature of prior art high speed applications.

FIG. 3 depicts a flip-chip electronic device 302 mounted to a BGA substrate 304 in a conventional manner. BGA substrate 304 includes a number of BGA solder balls 306 (shown in dashed lines because they would otherwise be obscured from view) arranged in a rectangular matrix. BGA solder balls 306a/306b correspond to two high speed signal connection points. Notably, BGA solder balls 306a/306b are each located at the periphery of BGA substrate 304. BGA solder balls 306a/306b are connected to respective interconnect vias that extend vertically through BGA substrate 304. These vias terminate at the flip-chip mounting surface of BGA substrate 304; the vias may terminate at conductive pads or lands formed by a suitable metal deposition process.

Electronic device 302 is mounted to BGA substrate 304 in a manner that establishes electrical contact between solder bumps on electronic device 302 and conductive contact pads formed on the device-mounting surface of BGA substrate 304. For the sake of illustration, FIG. 3 shows four solder bumps that would otherwise be hidden from view due to their location between electronic device 302 and BGA substrate 304. A solder bump 308 may correspond to one high speed signal termination and a solder bump 310 may correspond to another high speed signal termination. Solder bump 308 is coupled to solder ball 306a by a lateral conductive trace 312 formed on the upper surface of BGA substrate 304 and a respective interconnect via formed within BGA substrate 304. Likewise, solder bump 310 is coupled to solder ball 306b by a lateral conductive trace 314 formed on the upper surface of BGA substrate 304 and a respective interconnect via formed within BGA substrate 304. In most high speed applications (e.g., devices having input/output signals with data rates of up to 40 Gbps), such lateral conductive traces form a portion of a coplanar waveguide.

The high speed signals carried by BGA package 300 must propagate over the lateral traces, navigate a 90 degree trace-to-via transition, propagate through the interconnect vias formed in BGA substrate 304, and possibly navigate another 90 degree via-to-trace transition associated with the PCB (not shown). Lateral traces are necessary because the electronic device 302 is centrally mounted on BGA substrate 304 and due to physical space limitations near the periphery of BGA substrate 304 (caused by the package lid, package stiffeners, and/or dielectric underfill). The lateral signal transmission can result in various practical challenges such as impedance control and cross talk to adjacent signals and BGA substrate planes. Furthermore, manufacturing tolerances associated with lateral conductive traces 312/314 can induce impedance mismatching, resulting in poor edge rate and jitter performance.

Figure 4:
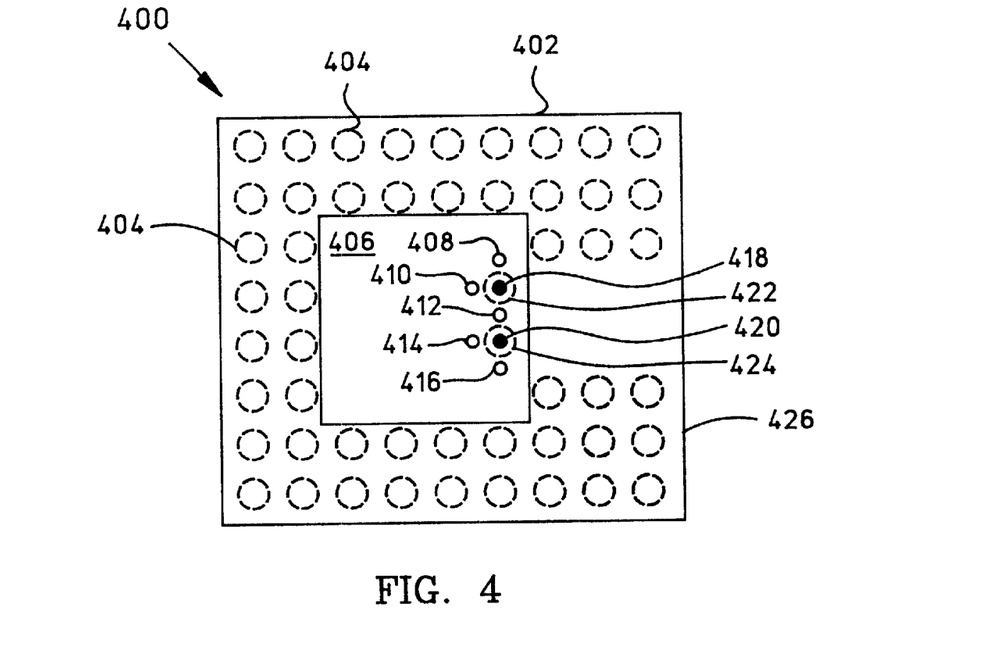
FIG. 4 is a top view of a ball grid array package configured in accordance with the present invention.

FIG. 4 is a top view of an example BGA package 400 configured in accordance with the present invention. BGA package 400 addresses the above shortcomings of prior art high speed designs without requiring extensive modifications to existing BGA package or flip-chip specifications. For the sake of clarity, BGA package 400 is depicted without a lid and with certain elements in phantom view. Furthermore, BGA package 400 represents a simplistic example layout suitable for purposes of this description. In reality, a BGA package according to the present invention may include any number of BGA solder balls, electronic device contact points, low speed lateral traces formed on the BGA substrate, and other features and elements that may not be shown or described herein.

BGA package 400 includes a BGA substrate 402 having a plurality of BGA solder balls 404. In accordance with conventional designs, BGA solder balls 404 are formed on an external surface of BGA substrate 402 (referred to herein as the component-mounting surface of BGA substrate 402, in contrast to the opposite device-mounting surface of BGA substrate 402). BGA solder balls 404 can be directly attached to conductive contact pads located on the component-mounting surface of BGA substrate 402. Alternatively, BGA solder balls 404 may be directly attached to respective interconnect vias formed within BGA substrate 402. BGA solder balls 404 function as electrical contact leads or conductive attachment elements between BGA substrate 402 and the PCB (or other component) to which BGA substrate 402 is attached.

BGA substrate 402 includes a number of peripheral BGA solder balls located around the perimeter of BGA substrate 402. In addition, BGA substrate 402 includes a number of interior BGA solder balls, each of which is bordered by the peripheral BGA solder balls. In other words, interior BGA solder balls are those that are not located at the outer perimeter of BGA substrate 402.

For compliance with accepted industry standards, BGA solder balls 404 are arranged in a regular pattern having a specific lateral pitch, i.e., the center-to-center distance, between neighboring solder balls. Consequently, a group of four neighboring BGA solder balls 404 define a square. The shape and size of BGA solder balls 404 are uniform for a given BGA substrate 402. For example, a BGA solder ball may be spherical or cylindrical in shape and have a height of approximately 500 microns. The composition of BGA solder balls 404, while typically uniform for a given BGA substrate 402, may vary depending upon the particular application. In accordance with conventional industry practice, BGA solder balls 404 can be formed from a tin/lead composition, where the ratio of tin to lead determines the melting temperature and other properties of BGA solder balls 404.

BGA substrate 402 may be considered to be a miniature multi-layer PCB having a number of conductive traces and conductive interconnect vias that form an interconnect arrangement within BGA substrate 402. In this manner, BGA substrate 402 is configured to convey signals from contact points on the device-mounting surface of BGA substrate 402 to the array of BGA solder balls 404 located on the component-mounting surface of BGA substrate 402. Although not shown in FIG. 4, BGA substrate 402 may include lateral conductive traces formed on the upper, lower, and/or internal surfaces, where such lateral traces are configured to carry low speed signals over the respective surface of BGA substrate 402.

BGA package 400 includes an electronic device 406 (e.g., a flip-chip device as depicted in FIG. 4) mounted to BGA substrate 402. Electronic device 406 is suitably mounted to BGA substrate 402 to establish conductive connections between contact pads or points on the device-mounting surface of BGA substrate 402 and corresponding contact points on electronic device 406. Electronic device 406 is positioned centrally on BGA substrate 402 to reduce thermally induced mechanical stress and to improve the reliability of BGA package 400.

In the example flip-chip embodiment shown in FIG. 4, electronic device 406 includes a number of solder bumps located on its mounting surface (in an alternate surface mount embodiment, contact pads on the upper surface of the electronic device are connected to corresponding contact pads on the devicemounting mounting surface of BGA substrate 402 with wire bonds, conductive ribbons, or the like). These solder bumps represent connection points or leads for various signals utilized by electronic device 406, e.g., input signals, output signals, clock signals, reference voltage nodes, power supply nodes, ground nodes, and the like. For the sake of clarity, FIG. 4 depicts only several flip-chip solder bumps, identified by reference numbers 408, 410, 412, 414, 416, 418, and 420. In this example, solder bumps 408/410/412/414/416 represent reference VSS/NVDD points, while solder bumps 418/420 represent high speed signal input/output connection elements. Although not a requirement of the present invention, high speed signal solder bumps 418/420 are located at or near the periphery of electronic device 406 (many practical high speed flip-chip devices are designed in this manner).

As shown in FIG. 4, from a top view perspective, flip-chip solder bump 418 is substantially aligned with a BGA solder ball 422, and flip-chip solder bump 420 is substantially aligned with a BGA solder ball 424. In practical embodiments utilizing vertical interconnect vias through BGA substrate 402, solder bumps 418/420 are also substantially aligned with respective interconnect vias. Thus, solder bump 418 is connected to a respective contact pad formed on the device-mounting surface of BGA substrate 402, the contact pad is connected to the respective interconnect via, and the via is connected to BGA solder ball 422. Likewise, solder bump 420 is connected to another contact pad, the contact pad is connected to a respective via, and the via is connected to BGA solder ball 424. By implementing this interconnection scheme, BGA package 400 need not utilize any lateral conductive traces from the high speed solder bumps to vias corresponding to high speed BGA solder balls located at the outer edge of BGA package 400.

In accordance with the present invention, a high speed interconnect via has one end directly connected to a high speed solder bump on the flip-chip device, and another end directly connected to one of the BGA solder balls on the BGA substrate 402. As used herein, a "via" may also include: a conductive contact pad on the device-mounting surface of BGA substrate 402; a conductive contact pad on the component-mounting surface of BGA substrate 402; and possibly other conductive elements embedded throughout the various layers of BGA substrate 402. In this regard, a "via" represents an electrically conductive path between the device-mounting and component-mounting surfaces of BGA substrate 402.

BGA solder balls 422/424 are each positioned in the interior portion of the ball matrix. In other words, BGA solder balls 422/424 are not located at the perimeter of the ball matrix. BGA substrate 402 may be configured to provide a clear "path" from BGA solder balls 422/424 to the edge of BGA substrate 402. In the example embodiment, the board-mounting surface of BGA substrate 402 is void of BGA solder balls between BGA solder balls 422/424 and an edge 426 of BGA substrate 402. In practice, selected BGA solder balls may be removed or eliminated during manufacturing of BGA substrate 402. The lack of BGA solder balls in this area provides easy access to BGA solder balls 422/424 by one or more high speed surface traces formed on the corresponding PCB.

Figure 5:
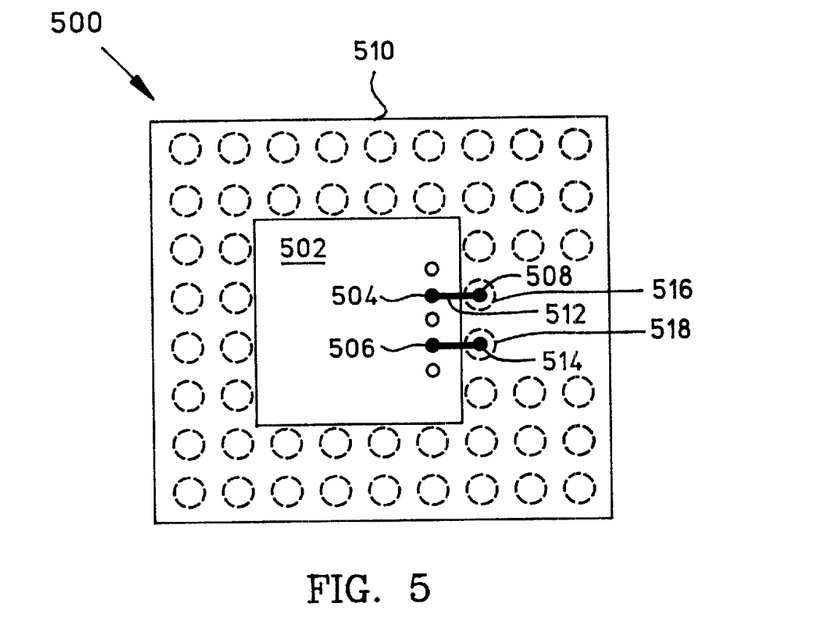
FIG. 5 is a top view of a ball grid array package configured in accordance with an alternate embodiment of the present invention.

FIG. 5 is a top view of a ball grid array package 500 configured in accordance with an alternate embodiment of the present invention that employs a surface mount electronic device 502. Electronic device 502 includes a signal contact pad 504 and a signal contact pad 506, each corresponding to a high speed input/output signal handled by the internal circuitry of electronic device 502. In this example, contact pads 504/506 are each formed on the upper surface of electronic device. Contact pad 504 is connected to a contact pad 508 formed on the devicemounting mounting surface of a BGA substrate 510. A conductive element 512 (e.g., a wire bond, a ribbon bond, a gold tab, or the like) forms the connection between contact pad 504 and contact pad 508. Contact pad 506 is connected to a contact pad 514 in a similar manner.

As depicted in FIG. 5, from a top view perspective, contact pad 508 is substantially aligned with a BGA solder ball 516, and contact pad 514 is substantially aligned with a BGA solder ball 518. In practical embodiments utilizing vertical interconnect vias through BGA substrate 510, contact pads 508/514 are also substantially aligned with respective interconnect vias. Thus, contact pad 508 is connected to a respective interconnect via, and the via is connected to BGA solder ball 516. Likewise, contact pad 514 is connected to a respective via, and the via is connected to BGA solder ball 518. By implementing this interconnection scheme, BGA package 500 need not utilize any lateral conductive traces from contact pads 508/514 to the vias corresponding to high speed BGA solder balls located at the outer edge of BGA package 500. Rather, as described above in connection with BGA package 400, BGA solder balls 516/518 are each positioned in the interior portion of the ball matrix, and BGA substrate 510 is preferably-configured to provide a clear path from BGA solder balls 516/518 to the edge of BGA substrate 510.

In a practical embodiment, the pitch between the flip-chip solder bumps is less than the pitch between the BGA solder balls. For example, the pitch of the BGA solder balls may be twice the pitch of the flip-chip solder bumps. Consequently, the design of the BGA package will consider the spacing of the electronic device solder bumps, the solder bump location of the desired high speed signal (or signals), and the BGA solder ball location corresponding to the desired high speed signal (or signals). These considerations will ensure that selected flip-chip solder bumps align with corresponding BGA solder balls.

Figure 6:
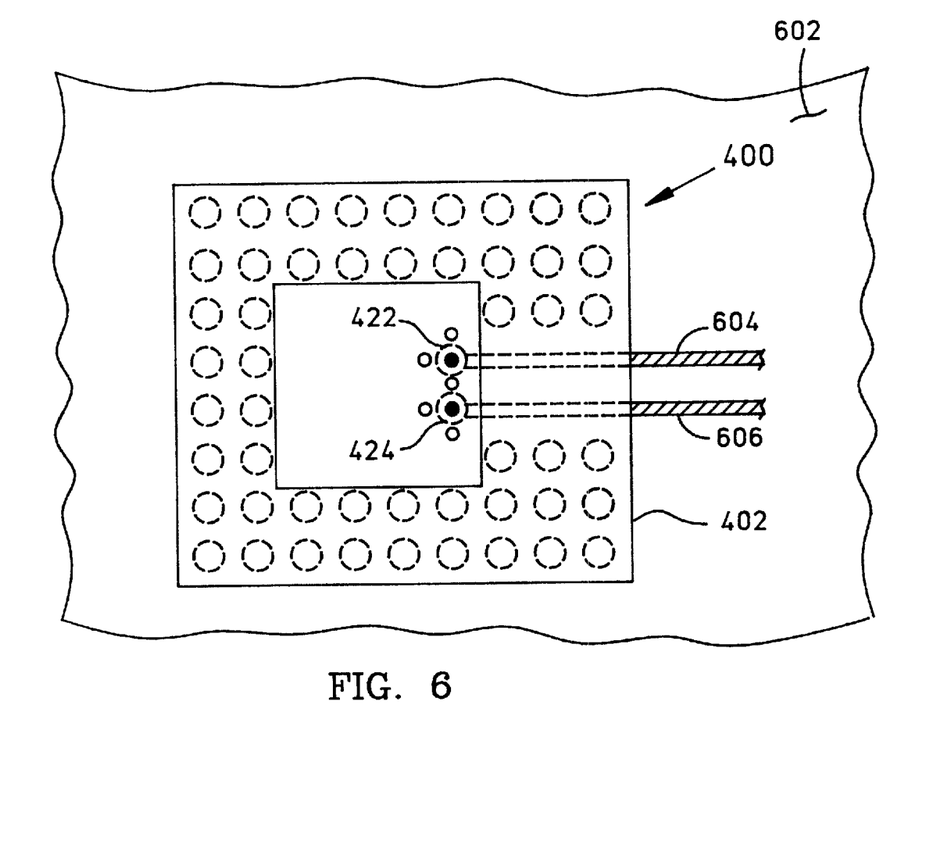
FIG. 6 is a top view of the ball grid array package shown in FIG. 4 mounted to a printed circuit board.

FIG. 6 is a top view of BGA package 400 as mounted to a PCB 602. The BGA solder balls form conductive connections with corresponding contact pads formed on the mounting surface of PCB 602. The example embodiment described herein includes BGA solder balls 422/424 corresponding to two high speed input/output signals. When BGA package 400 is properly mounted to PCB 602, BGA solder ball 422 is connected to a conductive trace 604 formed on the mounting surface of PCB 602, and BGA solder ball 424 is connected to a conductive trace 606 formed on the mounting surface of PCB 602. Portions of conductive traces 604/606 are shown in dashed lines because they would otherwise be hidden from view under BGA package 400.

As described above in connection with FIG. 4, BGA package 400 is suitably configured such that conductive traces 604/606 can be directly routed to BGA solder balls 422/424 without contacting other BGA solder balls. In the illustrated embodiment, BGA substrate 402 does not include BGA solder balls that would otherwise block the paths of conductive traces 604/606. In practice, a number of BGA solder balls can be removed from BGA substrate 402 to provide a clear path for conductive traces 604/606. Alternatively, BGA substrate 402 can be manufactured in a manner that avoids BGA solder ball formation at the appropriate locations. In yet another practical embodiment, conventional BGA substrates may be utilized if conductive traces 604/606 can be routed between the outlying BGA solder balls to the appropriate internal BGA solder balls corresponding to the high speed vias.

The elimination of lateral conductive traces on the BGA substrate improves the high speed performance of the BGA package. Indeed, a BGA package configured in accordance with the present invention exhibits a significant reduction in interconnect length and its related dielectric and conductor losses, a reduction in overall time delay of the high speed signals, and a reduction of crossover and crosstalk effects. Furthermore, the elimination of trace-to-via transitions results in better impedance control and improved high speed signal shielding (if the high speed signal via is surrounded with reference ground vias).

Figure 7:
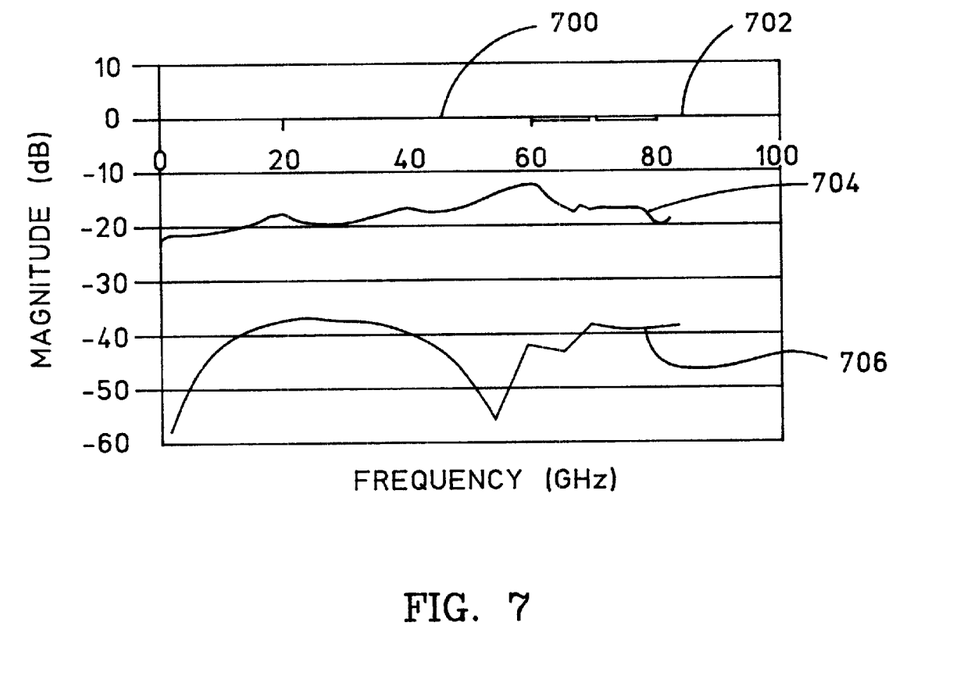
FIG. 7 is a graph of insertion loss and reflection loss for an example BGA package.

FIG. 7 is a graph of reflection loss and insertion loss for a simulated BGA package utilizing the techniques of the present invention. The graph represents the simulated performance of an interconnect via alone versus a signal path that includes a trace-to-via transition. The simulation is based upon a HTCC ceramic BGA substrate, cylindrical interconnect vias having a diameter of three mils, and a signal via to reference via pitch of ten mils. A first result 700 represents the insertion loss characteristic of the signal path having the trace-to-via transition; a second result 702 (virtually indistinguishable from the 0 dB line) represents the insertion loss characteristic of the interconnect via; a third result 704 represents the reflection loss characteristic of the signal path having the trace-to-via transition; and a fourth result 706 represents the reflection loss characteristic of the interconnect via.

At 60 GHz, the insertion loss for the signal path having the trace-to-via transition is approximately −1.1 dB and the reflection loss is approximately −15 dB. In contrast, at 60 GHz, the insertion loss for the interconnect via alone is approximately −0.009 dB and the reflection loss is approximately −42 dB. By eliminating the trace-to-via transition, the corresponding reflection loss and insertion ignificantly depressed.

The present invention has been described above with reference to a preferrd embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An electronic device package comprising:

an electronic device comprising a high speed signal input/output connection element; and an interconnect substrate comprising:

a device-mounting surface upon which said electronic device is mounted;

a component-mounting surface opposite said device-mounting surface;

a number of peripheral conductive attachment elements on said component-mounting surface;

a number of interior conductive attachment elements, bordered by said peripheral conductive attachment elements, on said component-mounting surface; and an interconnect via having a first end directly connected to said high speed signal input/output connection element and having a second end directly connected to one of said interior conductive attachment elements.

2. An electronic device package according to claim 1, wherein said interconnect via establishes a high speed electrical signal path between said high speed signal input/output connection element and said one of said interior conductive attachment elements.

3. An electronic device package according to claim 1, wherein said electronic device is configured to process an input/output signal corresponding to said high speed signal input/output connection element, said input/output signal having a data rate of up to 40 Gbps.

4. An electronic device package according to claim 1, wherein said electronic device is a flip-chip device.

5. An electronic device package according to claim 1, wherein said interconnect substrate is a ball grid array ("BGA") substrate.

6. An electronic device package according to claim 1, wherein said high speed signal input/output connection element, said interconnect via, and said one of said interior conductive attachment elements are aligned with one another.

7. An electronic device package according to claim 1, wherein said component-mounting surface of said interconnect substrate is void of interior and peripheral conductive attachment elements between said one of said interior conductive attachment elements and an edge of said interconnect substrate.

8. An electronic device package comprising:
an electronic device comprising a high speed signal input/output connection element;
an interconnect substrate comprising:
a device-mounting surface upon which said electronic device is mounted;
a component-mounting surface opposite said device-mounting surface;
a number of peripheral conductive attachment elements on said component-mounting surface;
a number of interior conductive attachment elements, bordered by said peripheral conductive attachment elements, on said component-mounting surface; and
an interconnect via having a first end terminating at a contact pad on said device-mounting surface and having a second end directly connected to one of said interior conductive attachment elements; and
a conductive bond element having a first end attached to said high speed signal input/output connection element and having a second end attached to said contact pad.

9. An electronic device package according to claim 8, wherein said interconnect via establishes a high speed electrical signal path between said high speed signal input/output connection element and said one of said interior conductive attachment elements.

10. An electronic device package according to claim 8, wherein said electronic device is configured to process an input/output signal corresponding to said high speed signal input/output connection element, said input/output signal having a data rate of up to 40 Gbps.

11. An electronic device package according to claim 8, wherein said interconnect substrate is a ball grid array ("BGA") substrate.

12. An electronic device package according to claim 8, wherein said contact pad, said interconnect via, and said one of said interior conductive attachment elements are aligned with one another.

13. An electronic device package according to claim 8, wherein said component-mounting surface of said interconnect substrate is void of interior and peripheral conductive attachment elements between said one of said interior conductive attachment elements and an edge of said interconnect substrate.

14. An electronic device package according to claim 8, wherein said conductive bond element comprises a wire bond.

15. An electronic device package according to claim 8, wherein said conductive bond element comprises a ribbon bond.

16. An electronic assembly comprising:
an electronic device comprising a high speed signal input/output connection element;
an interconnect substrate comprising:
a device-mounting surface upon which said electronic device is mounted;
a component-mounting surface opposite said device-mounting surface;
a number of peripheral conductive attachment elements on said component-mounting surface;
a number of interior conductive attachment elements, bordered by said peripheral conductive attachment elements, on said component-mounting surface; and
an interconnect via having a first end directly connected to said high speed signal input/output connection element and having a second end directly connected to one of said interior conductive attachment elements; and
a circuit board upon which said interconnect substrate is mounted, said circuit board comprising a high speed conductive trace connected to said one of said interior conductive attachment elements.

17. An electronic device package according to claim 16, wherein said electronic device is configured to process an input/output signal corresponding to said high speed signal input/output connection element, said input/output signal having a data rate of up to 40 Gbps.

18. An electronic device package according to claim 16, wherein said high speed signal input/output connection element, said interconnect via, and said one of said interior conductive attachment elements are aligned with one another.

19. An electronic device package according to claim 16, wherein said component-mounting surface of said interconnect substrate is void of interior and peripheral conductive attachment elements between said one of said interior conductive attachment elements and an edge of said interconnect substrate.

20. An interconnect substrate for an electronic device, said interconnect substrate comprising:
a device-mounting surface configured to receive an electronic device;
a high speed input/output signal contact pad on said device-mounting surface;
a component-mounting surface opposite said device-mounting surface;
a number of peripheral conductive attachment elements on said componentmounting surface;
a number of interior conductive attachment elements, bordered by said peripheral conductive attachment elements, on said component-mounting surface; and
an interconnect via having a first end directly connected to said high speed input/output signal contact pad and having a second end directly connected to one of said interior conductive attachment elements.

21. An electronic device package according to claim 20, wherein said component-mounting surface of said interconnect substrate is void of interior and peripheral conductive attachment elements between said one of said interior conductive attachment elements and an edge of said interconnect substrate.

* * * * *

UNITED STATES PATENT AND TRADEMARK OFFICE
CERTIFICATE OF CORRECTION

PATENT NO.   : 6,566,761 B1
DATED        : May 20, 2003
INVENTOR(S)  : Sharma et al.

It is certified that error appears in the above-identified patent and that said Letters Patent is hereby corrected as shown below:

<u>Title page,</u>
Item [75], Inventors, add -- Yang, Hong, San Diego, CA (US) --

Signed and Sealed this

Eleventh Day of November, 2003

JAMES E. ROGAN
*Director of the United States Patent and Trademark Office*